(12) United States Patent
Yamamoto

(10) Patent No.: US 7,952,696 B2
(45) Date of Patent: May 31, 2011

(54) EXPOSURE MEASUREMENT METHOD AND APPARATUS, AND SEMICONDUCTOR DEVICE MANUFACTURING METHOD

(75) Inventor: Tomohiko Yamamoto, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1322 days.

(21) Appl. No.: 10/973,448

(22) Filed: Oct. 27, 2004

(65) Prior Publication Data

US 2005/0277035 A1 Dec. 15, 2005

(30) Foreign Application Priority Data

Jun. 15, 2004 (JP) ................................. 2004-177098

(51) Int. Cl.
*G01B 9/00* (2006.01)
*G01B 11/02* (2006.01)
*G01B 11/04* (2006.01)
*G01B 11/08* (2006.01)
*G03F 9/00* (2006.01)
*G03C 5/00* (2006.01)

(52) U.S. Cl. .......... 356/124; 356/635; 356/636; 430/22; 430/30

(58) Field of Classification Search ........................ None
See application file for complete search history.

(56) References Cited

U.S. PATENT DOCUMENTS

| | | | | |
|---|---|---|---|---|
| 4,908,656 A | * | 3/1990 | Suwa et al. ...................... | 355/53 |
| 5,434,026 A | * | 7/1995 | Takatsu et al. .................. | 430/30 |
| 5,835,227 A | * | 11/1998 | Grodnensky et al. ......... | 356/399 |
| 6,063,531 A | * | 5/2000 | Singh et al. ...................... | 430/30 |
| 6,208,748 B1 | * | 3/2001 | Troccolo et al. ............... | 382/100 |
| 6,376,139 B1 | * | 4/2002 | Fujisawa et al. ................ | 430/30 |
| 6,440,616 B1 | * | 8/2002 | Izuha et al. ........................ | 430/5 |
| 6,493,063 B1 | * | 12/2002 | Seltmann et al. ............... | 355/53 |
| 6,514,122 B2 | * | 2/2003 | Saito et al. ......................... | 451/5 |
| 6,913,861 B2 | * | 7/2005 | Shishido et al. ................ | 430/30 |
| 6,929,892 B2 | * | 8/2005 | Shishido et al. ................ | 430/30 |
| 7,057,715 B2 | * | 6/2006 | Robinson ....................... | 356/124 |
| 7,250,235 B2 | * | 7/2007 | Izuha et al. ........................ | 430/5 |
| 7,414,713 B2 | * | 8/2008 | Yamamoto .................... | 356/123 |
| 7,474,382 B2 | * | 1/2009 | Fukumoto et al. ............... | 355/55 |

(Continued)

FOREIGN PATENT DOCUMENTS

JP 07-326563 A 12/1995

(Continued)

OTHER PUBLICATIONS

Japanese Office Action dated Feb. 23, 2010, issued in corresponding Japanese Patent Application No. 2004-177098.

(Continued)

*Primary Examiner* — Tarifur Chowdhury
*Assistant Examiner* — Gordon J Stock, Jr.
(74) *Attorney, Agent, or Firm* — Westerman, Hattori, Daniels & Adrian, LLP

(57) ABSTRACT

An exposure measurement apparatus is configured by including a size measurer measuring respective sizes of at least a pair of transferred patterns having mutually different optimal focus positions out of a plurality of transferred patterns formed by being transferred onto a transfer object, a difference value calculator obtaining a difference value between the size of one transferred pattern and the size of the other transferred pattern, a focus variation amount calculator calculating a focus variation amount of the transfer object using the difference value, and an exposure variation amount calculator calculating an exposure error amount of a wafer.

32 Claims, 15 Drawing Sheets

U.S. PATENT DOCUMENTS

| | | | |
|---|---|---|---|
| 7,642,019 B2 * | 1/2010 | Kim | 430/30 |
| 2002/0015158 A1 | 2/2002 | Shiode et al. | |
| 2002/0131055 A1 * | 9/2002 | Niu et al. | 356/603 |
| 2003/0219658 A1 * | 11/2003 | Shishido et al. | 430/30 |
| 2004/0008329 A1 * | 1/2004 | Nakae | 355/53 |
| 2004/0131951 A1 * | 7/2004 | Izuha et al. | 430/5 |
| 2004/0223137 A1 * | 11/2004 | Littau et al. | 356/123 |
| 2005/0069791 A1 * | 3/2005 | Yamamoto | 430/30 |

FOREIGN PATENT DOCUMENTS

| | | | |
|---|---|---|---|
| JP | 8-148490 | | 6/1996 |
| JP | 08-316123 A | | 11/1996 |
| JP | 09-092606 A | | 4/1997 |
| JP | 11-186145 | | 7/1999 |
| JP | 11307431 A | * | 11/1999 |
| JP | 2001-351853 | | 12/2001 |
| JP | 2002-289494 A | | 10/2002 |
| JP | 2003347201 A | * | 12/2003 |
| JP | 2004-079911 A | | 3/2004 |

OTHER PUBLICATIONS

Japanese Office Action dated May 25, 2010, issued in corresponding Japanese Patent Application No. 2004-177098.

* cited by examiner

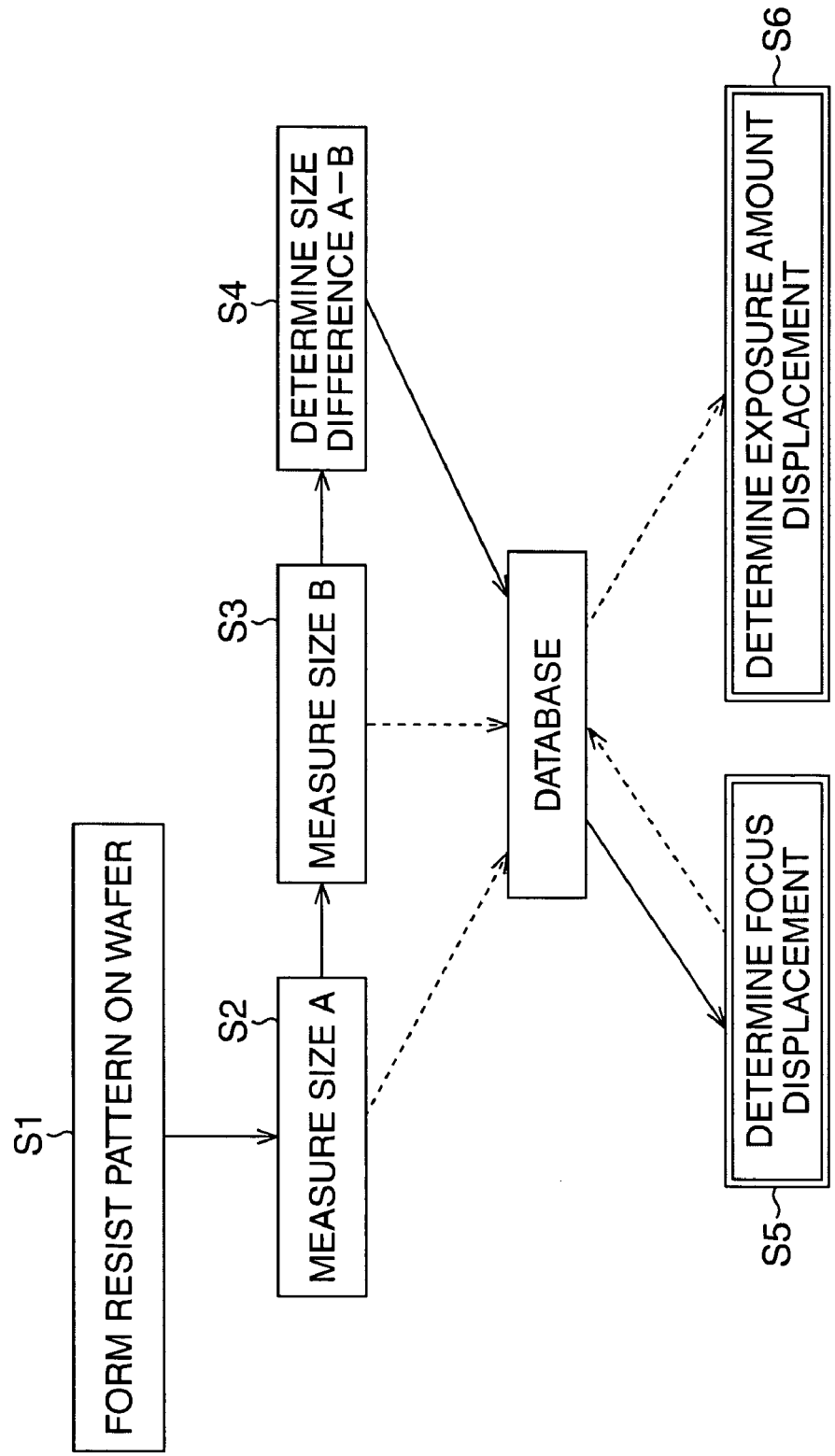

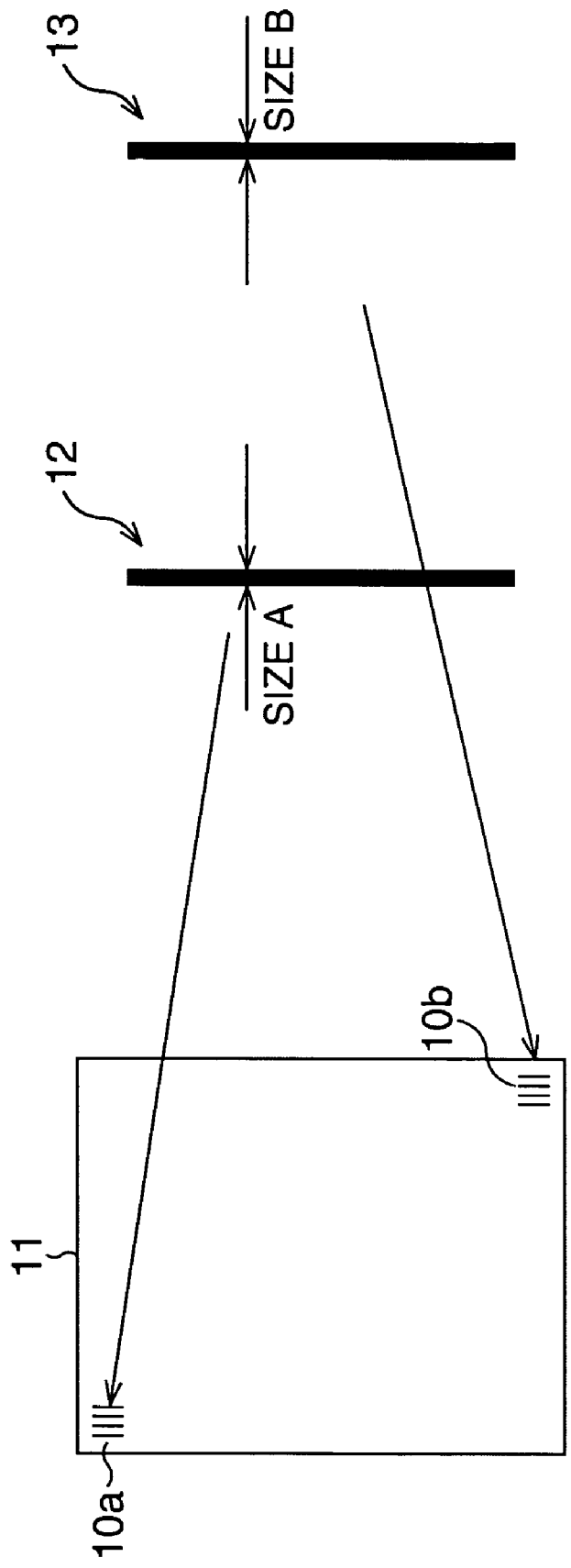

RELATION BETWEEN PATTERN SIZE AND FOCUS

RELATION BETWEEN PATTERN SIZE DIFFERENCE AND FOCUS

FIG. 5

| | FOCUS | −0.06 | −0.03 | 0 | 0.03 | 0.06 | 0.09 | 0.12 |
|---|---|---|---|---|---|---|---|---|
| PATTERN A | EXPOSURE AMOUNT OVER BY 2.5% | 0.063 | 0.067 | 0.069 | 0.067 | 0.063 | 0.054 | 0.039 |
| | OPTIMAL EXPOSURE AMOUNT | 0.064 | 0.069 | 0.070 | 0.069 | 0.064 | 0.056 | 0.041 |
| | EXPOSURE AMOUNT UNDER BY 2.5% | 0.066 | 0.070 | 0.071 | 0.070 | 0.066 | 0.058 | 0.044 |
| PATTERN B | EXPOSURE AMOUNT OVER BY 2.5% | 0.039 | 0.054 | 0.063 | 0.067 | 0.069 | 0.067 | 0.063 |
| | OPTIMAL EXPOSURE AMOUNT | 0.041 | 0.056 | 0.064 | 0.069 | 0.070 | 0.069 | 0.064 |
| | EXPOSURE AMOUNT UNDER BY 2.5% | 0.044 | 0.058 | 0.066 | 0.070 | 0.071 | 0.070 | 0.066 |
| A−B | EXPOSURE AMOUNT OVER BY 2.5% | 0.024 | 0.013 | 0.006 | 0.000 | −0.006 | −0.013 | −0.024 |
| | OPTIMAL EXPOSURE AMOUNT | 0.023 | 0.013 | 0.006 | 0.000 | −0.006 | −0.013 | −0.023 |
| | EXPOSURE AMOUNT UNDER BY 2.5% | 0.022 | 0.012 | 0.006 | 0.000 | −0.006 | −0.012 | −0.022 |

PATTERN IMAGE

SHOT IMAGE

SHOT IMAGE

PATTERN IMAGE

PATTERN IMAGE

SHOT IMAGE

FIG. 12

| | PROCESSING CONDITION | | DISPLACEMENT AMOUNT |
|---|---|---|---|
| LOT A | EXPOSURE AMOUNT<br>FOCUS<br>FOCUS GRADIENT | 200J<br>0.0μm<br>0ppm | 3J<br>0.03μm<br>0.3ppm |
| LOT B | EXPOSURE AMOUNT<br>FOCUS<br>FOCUS GRADIENT | 197J<br>−0.03μm<br>−0.3ppm | −1J<br>0.01μm<br>−0.1ppm |
| LOT C | EXPOSURE AMOUNT<br>FOCUS<br>FOCUS GRADIENT | 198J<br>−0.04μm<br>−0.2ppm | 5J<br>−0.02μm<br>−0.1ppm |
| LOT D | EXPOSURE AMOUNT<br>FOCUS<br>FOCUS GRADIENT | 193J<br>−0.02μm<br>−0.1ppm | −2J<br>0.0μm<br>−0.1ppm |
| LOT x | EXPOSURE AMOUNT<br>FOCUS<br>FOCUS GRADIENT | ×<br>×<br>× | ×<br>×<br>× |

EXPOSURE MEASUREMENT METHOD AND APPARATUS, AND SEMICONDUCTOR DEVICE MANUFACTURING METHOD

CROSS-REFERENCE TO RELATED APPLICATIONS

This application is based upon and claims the benefit of priority from the prior Japanese Patent Application No. 2004-177098, filed on Jun. 15, 2004, the entire contents of which are incorporated herein by reference.

BACKGROUND OF THE INVENTION

1. Field of the Invention

The present invention relates to a measurement method and an apparatus for measuring a focus error amount and so forth when a pattern is exposed in a lithographic process for manufacturing a semiconductor device and a display device such as a liquid crystal, and a semiconductor device manufacturing method.

2. Description of the Related Art

Recently, along with highly improving density of a semiconductor element, a pattern formed by a lithography technique shows progress in microfabrication. The finer the pattern becomes, the smaller the requirement for size uniformity becomes. As one major cause that deteriorates the size uniformity, a focus variation (focus error) of an aligner can be cited. When the focus error arises, the formed pattern varies in size, which is especially remarkable in the case of an isolated pattern and the like having small depth of focus that extremely decreases the width. For instance, it is generally said that for manufacturing a semiconductor element of 90 nm generation, a focus control at a level of ±50 nm is required.

Conventionally, the focus control in the aligner is performed in the following manner, as an example. First a sample wafer is fabricated by adopting various focus values in on-condition maintenance and the like, the width of the isolated pattern or the like is measured using a CD-SEM or so forth, and thereafter, an optimal focus value is determined by drawing a CD-focus curve. Then, the result is stored on the side of the aligner as an offset value to thereby control the focus.

Further, as another actual example of a so-called in-line focus monitor technique, the following are disclosed. In Japanese Patent Application Laid-Open No. Hei 11-186145 (Patent document 1), there is disclosed a focus variation measurement technique in which a relation between an angle of gradient of an edge and a focus position both of a resist pattern is obtained to thereby calculate a taper angle of the resist pattern formed on a wafer, so that the focus variation is measured. In Japanese Patent Application Laid-Open No. 2001-351853 (Patent document 2), there is disclosed a focus value measurement technique in which a focus value is measured by measuring a length of a resist pattern in the longitudinal direction using a dedicated mask and variation in thickness of the resist pattern.

[Patent Document 1] Japanese Patent Application Laid-Open No. Hei 11-186145

[Patent Document 2] Japanese Patent Application Laid-Open No. 2001-351853

[Patent Document 3] Japanese Patent Application Laid-Open No. Hei 8-148490

The focus control of the conventional technique requires long hours to measure a pattern size, so that the control by a time unit less than one day is difficult. Still more, it is impossible to monitor the focus variation by a time unit of several hours or less than that. In addition, in the course of a normal processing of products, no such a processing in which the focus varies in the wafer or in a lot is performed, so that a focus control using a product wafer is considered to be impossible.

Furthermore, in the in-line focus monitor technique disclosed at present, the detectable focus variation cannot satisfy a required accuracy, causing a problem that measurement repeatability and measurement accuracy are not improved in the measurement using the CD-SEM. As a consequence, a focus monitor with high accuracy is unable to be performed.

SUMMARY OF THE INVENTION

The present invention has been made to bring a solution to the above-described problem, and an object of the present invention is to measure a focus error easily with high accuracy, and ultimately to provide an exposure measurement method and apparatus and a semiconductor device manufacturing method capable of manufacturing semiconductor devices stably.

According to one aspect of the present invention, there is provided an exposure measurement method that includes a step of measuring respective sizes of at least a pair of transferred patterns having mutually different optimal focus positions out of a plurality of transferred patterns formed by being transferred onto a transfer object, a step of obtaining a difference value between the size of one transferred pattern and the size of the other transferred pattern, and a step of calculating a focus variation amount of the transfer object using the difference value.

According to another aspect of the present invention, there is provided an exposure measurement apparatus that includes a size measurer measuring respective sizes of at least a pair of transferred patterns having mutually different optimal focus positions out of a plurality of transferred patterns formed by being transferred onto a transfer object, a difference value calculator obtaining a difference value between the size of one transferred pattern and the size of the other transferred pattern, and a focus variation amount calculator calculating a focus variation amount of the transfer object using the difference value.

According to still another aspect of the present invention, there is provided a semiconductor device manufacturing method that includes a first step for forming a plurality of transferred patterns onto a transfer object, a second step for measuring respective sizes of at least a pair of transferred patterns mutually having different optimal focus positions out of the plurality of transferred patterns, a third step for obtaining a difference value between the size of one transferred pattern and the size of the other transferred pattern, a fourth step for calculating a focus variation amount of the transfer object using the difference value, and a fifth step for determining whether or not the calculated focus variation amount meets a standard, in which if the focus variation amount is determined to meet the standard, then a procedure goes to a next step and if the focus variation amount is determined to be out of the standard, then the plurality of transferred patterns are removed and the first to fifth steps are reexecuted thereafter.

BRIEF DESCRIPTION OF THE DRAWINGS

FIG. 2 is a schematic flowchart showing an exposure measurement method using the exposure measurement apparatus according to the first embodiment step by step;

FIGS. 3A and 3B are schematic plan views showing an example of a pattern used in the first embodiment;

FIG. 5 is a schematic view showing an example database used in the first embodiment;

FIG. 12 is a schematic diagram for illustrating a correction method of a focus error and an exposure error according to the first embodiment;

DETAILED DESCRIPTION OF THE PREFERRED EMBODIMENTS

Basic Gist of the Present Invention

A measurement value of a size of a transferred pattern is approximated to a focus error generally by an even-number order function. Accordingly, when a focus error arises, it is difficult to determine a displacement to be of positive or negative. More specifically, this means that it is possible to determine whether a positive displacement or a negative displacement if the value is approximated to the focus error by a monotone increasing function or a monotone decreasing function of an odd-number order, in general. The present inventor has conceived of the present invention by focusing attention to this fact. In other words, under a single exposure condition, a difference value between one transferred pattern and the other transferred pattern are calculated by using a pair of (two) transferred patterns having mutually different optimal focus positions and by measuring respective sizes thereof. The difference value is a value approximated to the focus error generally by the odd-number order function, so that the focus error can be measured accurately based for example on a database having a data indicating a relation between the difference value and the focus error. Based on this focus error amount, an exposure error amount can be determined accurately using a database having a data indicating for example a relation between the focus error, which is obtained from the sizes of the transferred patterns and the above-described technique, and the exposure error amount.

In the present invention, the calculated focus error amount and the exposure error amount are fed back to a lot composed of the next respective transfer objects or the plurality of transfer objects, and further be fed forward to a process following a patterning process, so that an accurate patterning can be realized and the next and following processes can be optimized.

Specific Embodiments of the Present Invention

Hereinafter, specific embodiments adopting the present invention will be described in detail with reference to the drawings.

First Embodiment

In the present embodiment, an exposure measurement apparatus and method, and a semiconductor device manufacturing method according to the present invention will be described.

[Structure of the Exposure Measurement Apparatus]

Figure 1:
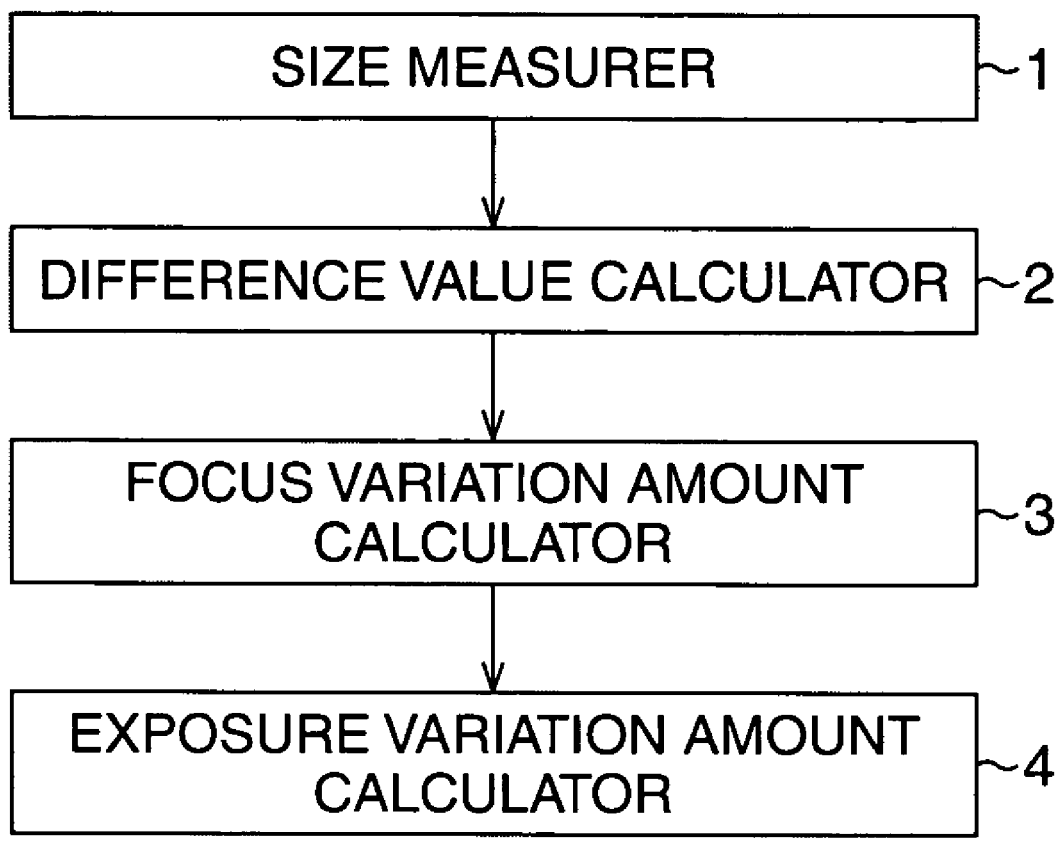
FIG. 1 is a schematic block diagram showing a structure of an exposure measurement apparatus according to a first embodiment.

FIG. 1 is a block diagram schematically showing a structure of the exposure measurement apparatus according to the present embodiment. The exposure measurement apparatus is structured to include a size measurer 1 for measuring respective sizes of at least a pair of transferred patterns having mutually different optimal focus positions out of a plurality of transferred patterns formed by being transferred for example onto a silicon wafer being a transfer object, a difference value calculator 2 for obtaining a difference value between the size of one transferred pattern and the size of the other transferred pattern, and a focus variation amount calculator 3 for calculating a focus error amount of the silicon wafer when the pattern is transferred using the difference value, and an exposure variation amount calculator 4 for calculating an exposure error amount of the silicon wafer using the sizes of respective transferred patterns and the focus error amount.

The size measurer 1 is a measurement apparatus of various types that enables a highly accurate measurement, such as an electron microscope, an atomic force microscope, an optical width measurement apparatus, or the like. The difference value calculator 2 calculates the difference value from the respective sizes obtained by the size measurer 1 not as an absolute value but as a positive value (includes zero (0)) or a negative value. The focus variation amount calculator 3 and exposure variation amount calculator 4 determine the focus error amount from a data indicating a relation between the difference value and the focus error amount and the exposure error amount from a data indicating a relation between the size of the transferred pattern (or an average value of the respective sizes) and the focus error amount and exposure error amount using databases holding both the data.

[Exposure Measurement Method]

FIG. 2 is a flowchart showing an exposure measurement method using the above-described exposure measurement apparatus in order of step.

First, a predetermined pattern is formed on a silicon wafer (step S1). Here, an example pattern used in the present embodiment is shown in FIGS. 3A and 3B. FIG. 3A illustrates a shot image at a time of an exposure, FIG. 3B illustrates a pattern image transferred, respectively, and are the results of forming a transferred pattern on the silicon wafer, as a resist pattern having 70 nm in width, using a photomask in which a line and space (L & S) pattern with the pitch=180 nm and the size=70 nm is formed under a design (mask data), when using a test pattern transferred using a zone illumination system of NA=0.85.

In one exposure site (one shot) 11 as shown in FIG. 3A, it is assumed that optimal focus positions are different with each other between pattern images 10a, 10b. A pair of transferred patterns 12, 13 as shown in FIG. 3B are selected, and the widths A, B of the pair of transferred patterns 12, 13 are measured respectively using the size measurer 1 (step S2, S3). In FIG. 3A, a line and space pattern is illustrated as an example measurement target, and even in this case, the focus error can be recognized correctly, whereas, the focus error can be estimated more correctly when using an isolated pattern being more sensitive to a focus. At that time, the smaller the width is, the higher the sensitivity to the focus variation is, so that, as long as it is for example in a range allowed by a design rule, the transferred pattern having a smaller width as much as possible is considered to be suitable.

Figure 4A:
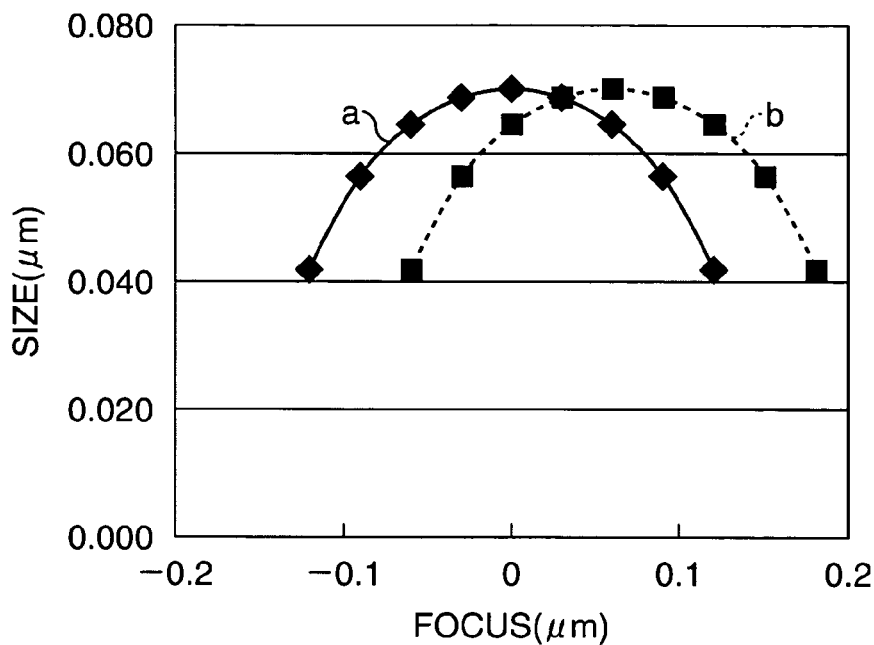
FIGS. 4A and 4B are characteristic charts showing a relation between a width of a transferred pattern and a focus, and a relation between a difference between the widths of the transferred patterns and the focus, respectively.
Figure 4B:
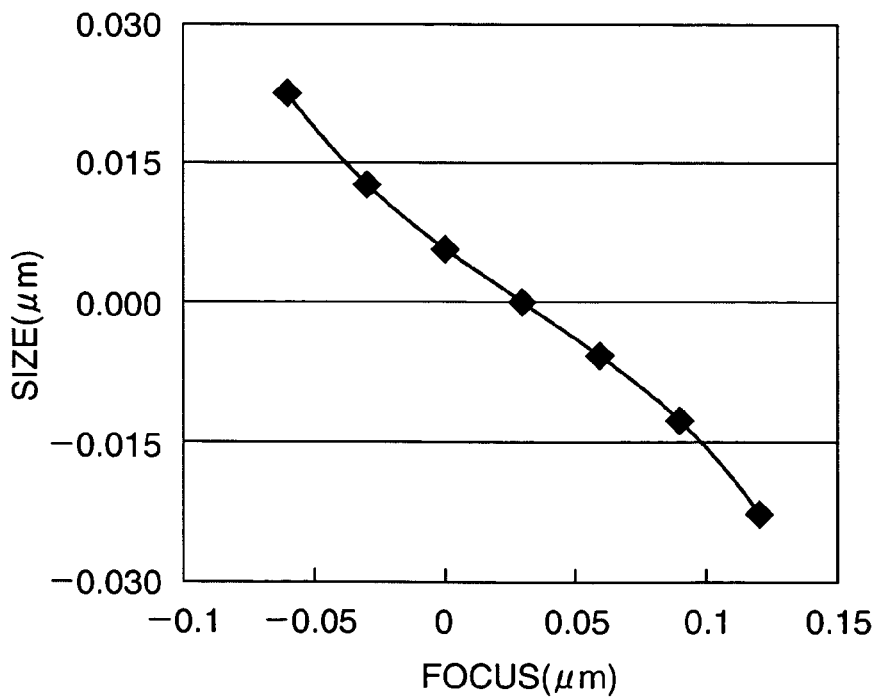

Subsequently, the difference value (A−B) between the transferred pattern 12 and the transferred pattern 13 is calculated using the difference value calculator 2 (step S4). Here, FIG. 4A shows a relation between the width of the transferred pattern shown in FIG. 3B and the focus, and FIG. 4B shows a relation between the difference value of the widths of the transferred patterns shown in FIG. 3B and the focus, respectively. As shown in FIG. 4A, a characteristic curb of one transferred pattern is denoted by "a", and a characteristic curb of the other transferred pattern is denoted by "b". In the case of the characteristic curbs "a" and "b", there is a difference of 0.06 μm between their optimal focus positions. Hypothetically speaking, but, when trying to form these two transferred patterns, it is preferable to determine an intermediate position 0.03 μm between 0 μm and 0.06 μm as an optimal focus condition and execute a processing of a product. At that time, the difference value comes to 0 nm, and if a focus error arises here, for example, if the focus shifts toward a negative direction, the difference shifts toward a positive direction. On the other hand, if the focus shifts toward the positive direction, the difference shifts toward the negative direction. Making use of this feature allows determining whether the focus error is of positive or negative, so that the focus error amount and the exposure error amount can be determined accurately.

Subsequently, with the use of the focus variation amount calculator 3 and the exposure variation amount calculator 4, the calculated width A, width B, and difference value A−B are inputted into a database. The database holds a data indicating the relation between the difference value and the focus error amount, and a data indicating the relation between the size of the transferred pattern (or an average value of respective sizes) and the focus error amount and the exposure error amount, respectively. With the former data, the focus error is determined (step S5), and with the latter data, the exposure error amount is determined (step S6).

Here, one example of the above-described database is shown in FIG. 5.

This database indicates, when the focus amount and the exposure amount vary with regard to the pair of transferred patterns A, B, the relation between the variation amount and the width and the difference value. For instance, assuming that the width of the transferred pattern 12 is 0.054 μm, and the width of the transferred pattern 13 is 0.067 μm. Then, it is determined that the focus position when the pattern was transferred onto the silicon wafer was 0.09 μm, since the difference value (A−B) between the transferred patterns 12, 13 is −0.013 μm. Further, by referring to the widths A, B of the transferred patterns 12, 13, the exposure variation amount can be extracted. In this case, since the width A is 0.054 μm, it is found that exposure energy exceeds the optimal exposure amount by 2.5%. Specifically, with the use of this database, the focus error amount and the exposure error amount can be detected.

TRANSFERRED PATTERN EXAMPLES

Hereinafter, for transferred patterns used in the above-described exposure measurement apparatus and method to determine a focus error, those examples other than the above-described isolated pattern will be described.

First Example

Figure 6B:
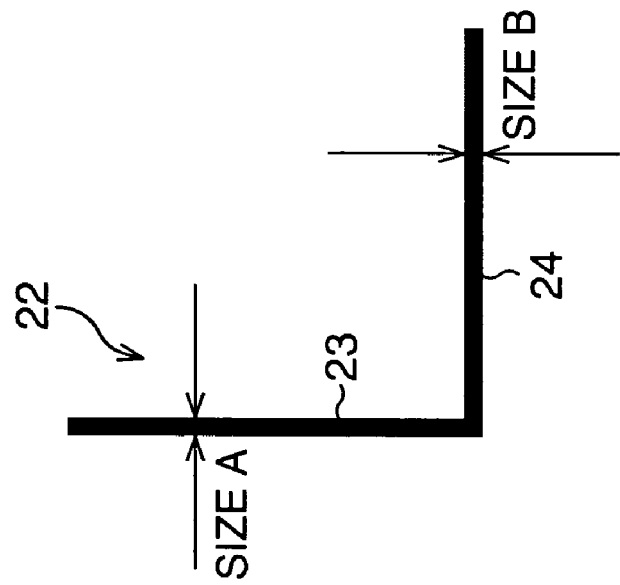
FIGS. 6A and 6B are schematic plan views showing a pattern of a first example according to the first embodiment.
Figure 6A:
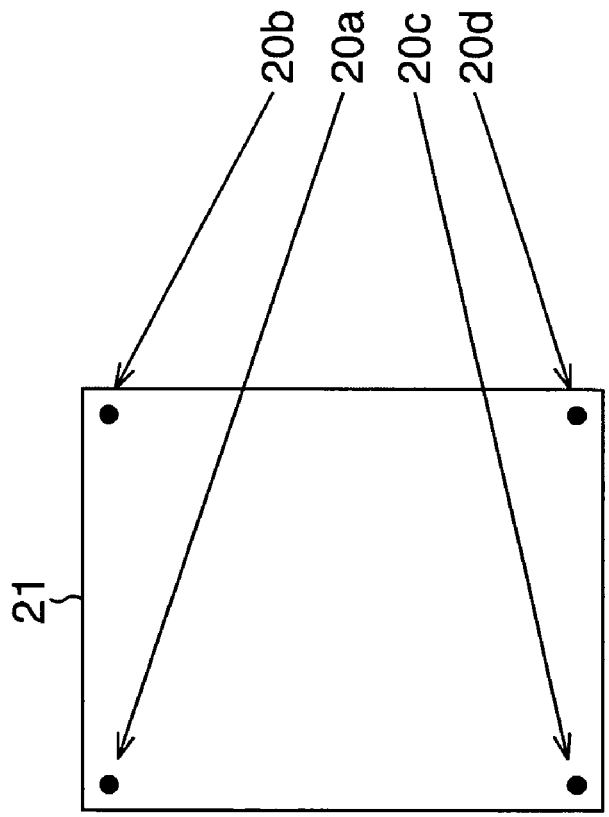

FIGS. 6A and 6B are plan views showing a pattern of a first example according to the present embodiment. FIG. 6A shows a shot image when the patterns are exposed, and FIG. 6B shows a pattern image transferred, respectively.

In this example, pattern images 20a to 20d are inserted into four corners of an exposure site (one shot) 21 being one exposure site as shown in FIG. 6A. A resist pattern corresponding to each pattern image is to have a kinked line shape, here, an L-shaped pattern 22 being in a substantially L shape as shown in FIG. 6B, and the mutually crossing respective straight line patterns of the L-shaped pattern 22 constitute a pair of transferred patterns 23, 24.

Generally, an aligner has aberration of a lens in the nature thereof. The aberration is designed to come to be small as much as possible, but it is impossible to bring it to completely zero (0). For instance, in the case of the lens having astigmatism, a difference appears at an optimal focus position of the mutually crossing patterns. Therefore, when using the aligner having astigmatism, it is possible to read out the focus error amount and the exposure error amount from the pair of transferred patterns 23, 24 of the present example.

Here, the reason for inserting the height of images into four corners of one shot is because thereby a tilt component of the focus error amount can be read out. By measuring the focus error amounts of four points, tilt component in the X direction and Y direction can be estimated. In this case, a pair of transferred patterns is adjacent to each other, so that a possible error ascribable to a false identity of the pattern images can be prevented to a small level, and the focus error and the exposure error can be detected more accurately.

Second Example

Figure 7B:
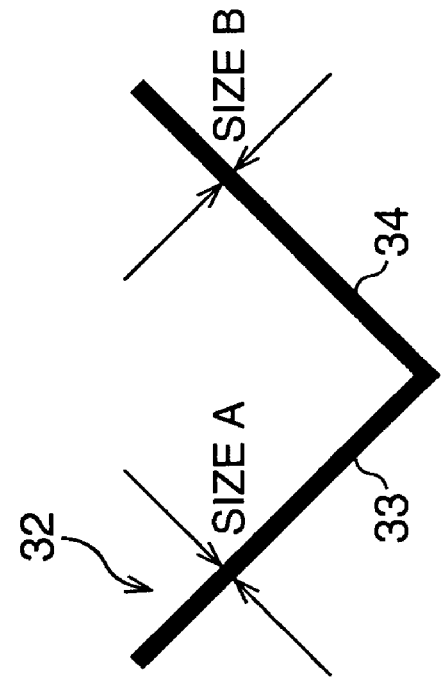
FIGS. 7A and 7B are schematic plan views showing a pattern of a second example according to the first embodiment.
Figure 7A:
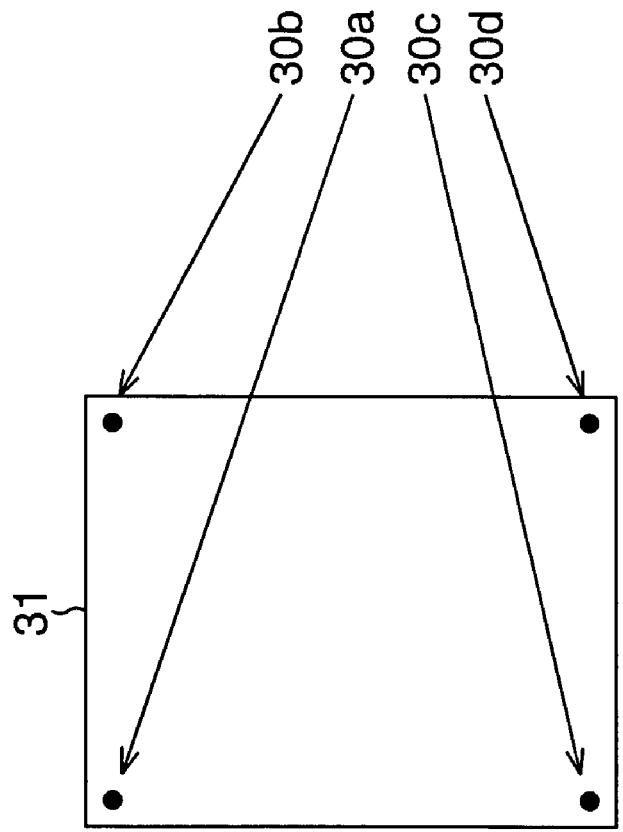

FIGS. 7A and 7B are plan views showing a pattern of a second example according to the present embodiment, in which FIG. 7A shows a shot image when the patterns are exposed, and FIG. 6B shows a pattern image transferred, respectively.

In this example, pattern images 30a to 30d are inserted into four corners of an exposure site (one shot) 31 being one exposure site as shown in FIG. 7A. A resist pattern corresponding to each pattern image is to have a kinked line shape, here, a V-shaped pattern 32 being in a substantially V shape as shown in FIG. 7B, and the mutually crossing respective straight line patterns of the V-shaped pattern 32 constitute a pair of transferred patterns 33, 34. Specifically, the V-shaped pattern 32 of this embodiment is the L-shaped pattern 22 of previously described example 1 turned at an angle of 45 degrees on the document.

The V-shaped pattern 32 allows reading out the focus error amount and the exposure error amount from the pair of transferred patterns 23, 24 in this example when using an aligner having aberration, as in the case of the L-shaped pattern 22.

When such an obliquely-shaped pattern is prohibited under a design of a device, there is sometimes a case having no problem even if a large astigmatism arises due to such an obliquely-shaped pattern. Based on this, by designing such that the astigmatism becomes large with regard to the V-shaped pattern 32, and by prohibiting to form such a V-shaped pattern 32, but positively insert the prohibited V-shaped patterns 32 to thereby use them to detect the exposure error amount. Considering based on a purpose of the present invention to use the difference value in size between a pair of transferred patterns, the larger the astigmatism is, the easier to detect the focus error and the exposure error. It is therefore found that the V-shaped pattern 32 of this example is an effective pattern for the present invention.

Third Example

Figure 8A:
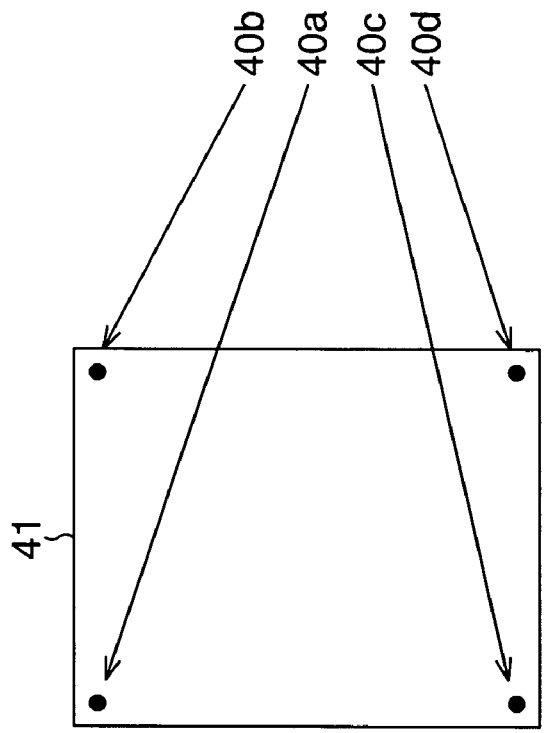
FIGS. 8A and 8B are schematic plan views showing a pattern of a third example according to the first embodiment.
Figure 8B:
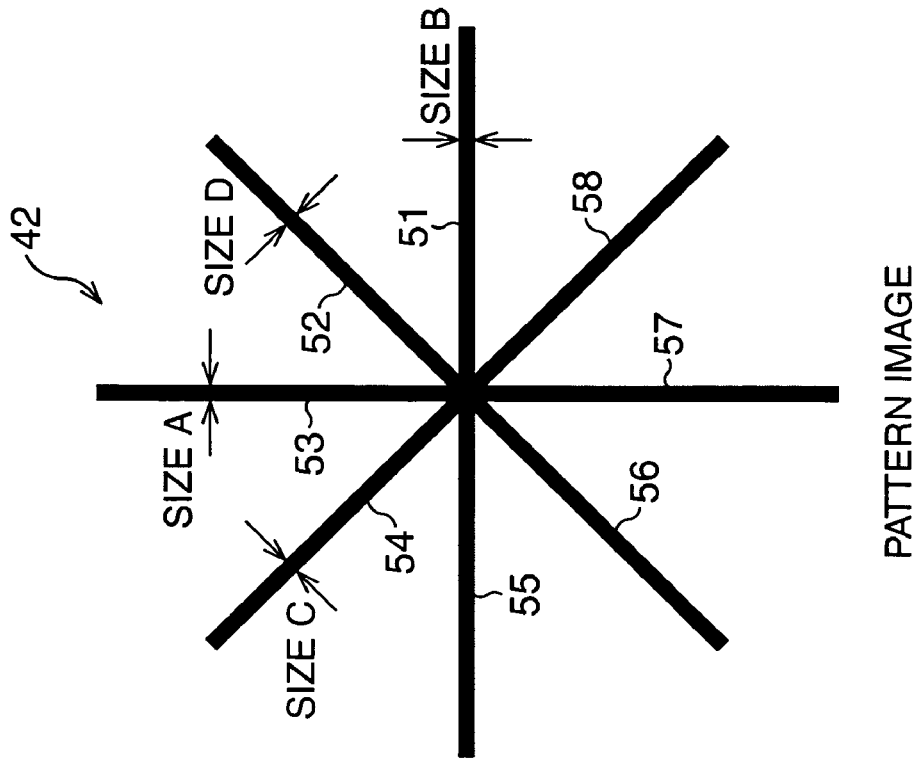

FIGS. 8A and 8B are plan views showing a pattern of a third example according to the present embodiment, in which FIG. 8A shows a shot image when exposed and FIG. 8B shows a pattern image transferred, respectively.

In this example, pattern images 40a to 40d are inserted into four corners of an exposure site (one shot) 41 being one exposure site as shown in FIG. 8A. A resist pattern corresponding to each pattern image is in a combined shape of the L-shaped pattern 22 and the V-shaped pattern 32 on the whole as shown in FIG. 8B, which is a radial pattern 42 having eight straight line patterns 51 to 58 extending radially from the center thereof. Out of the straight line patterns 51 to 58 of the radial pattern 42, the two straight patterns, which are orthogonal to each other (straight line patterns 51, 53, straight line patterns 52, 54, and so forth) constitute a pair of transferred patterns, respectively.

Depending on the aligner, there is a case where the aligner has a small astigmatism for example to a pair of transferred patterns of which patterns cross with each other at an angle of 0 (zero) degrees and 90 degrees (for example, straight patterns 51, 53) but has a large astigmatism to a pair of transferred patterns of which patterns cross with each other at an angle of 45 degrees and 135 degrees (for example, straight patterns 52, 54), and so forth. The radial pattern 42 is effective especially for the case described above. Thus, the focus error and the exposure error can be detected with extreme accuracy.

Fourth Example

Figure 9B:
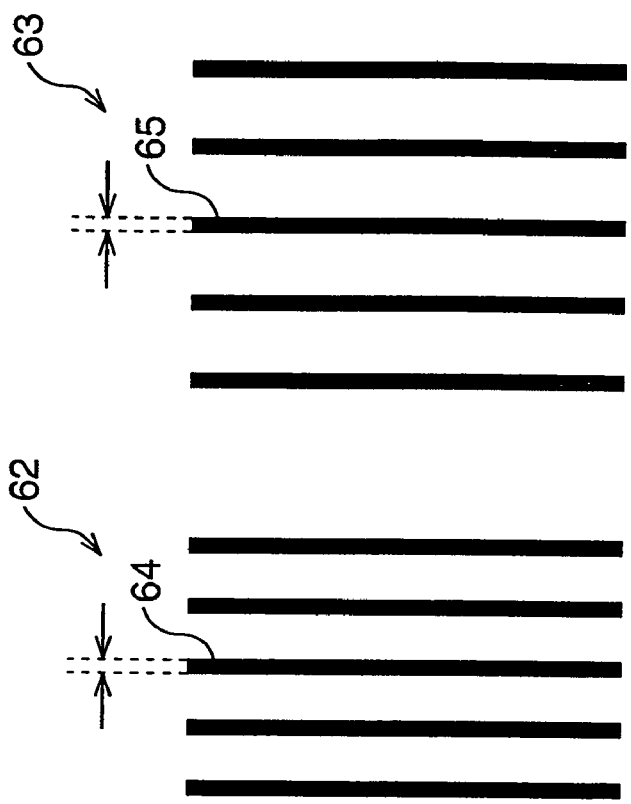
FIGS. 9A and 9B are schematic plan views showing a pattern of a fourth example according to the first embodiment.
Figure 9A:
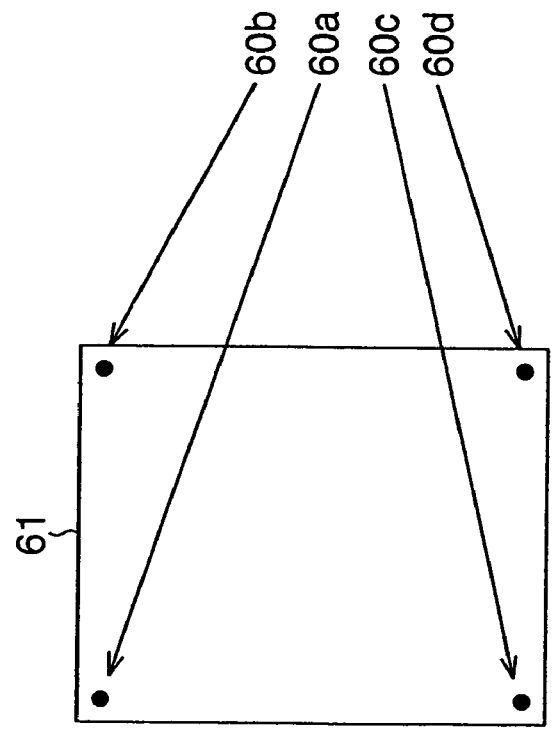

FIGS. 9A and 9B are plan views showing a pattern of a fourth example according to the present embodiment, in which FIG. 9A shows a shot image when exposed and FIG. 9B shows a pattern image transferred, respectively.

In this example, pattern images 60a to 60d are inserted into four corners of an exposure site (one shot) 61 being one exposure site as shown in FIG. 9A. A resist pattern corresponding to each pattern image is line and space (L & S) patterns 62, 63 constituted by a plurality of straight line patterns aligned adjacently in parallel. Here, respective L & S patterns 62, 63 are formed to have mutually different pitches.

Figure 10A:
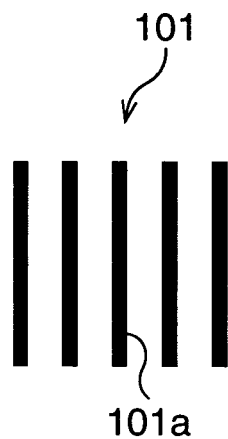
FIGS. 10A to 10C are schematic plan views showing the pattern of the fourth example and a comparison example thereof.
Figure 10B:
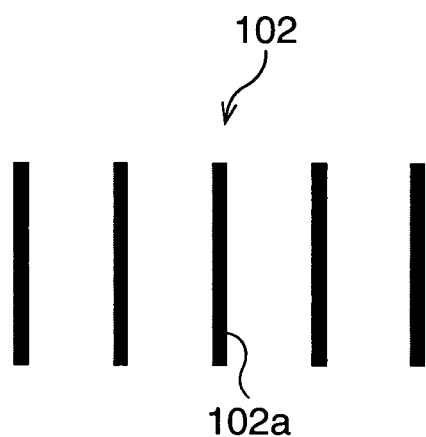
Figure 10C:
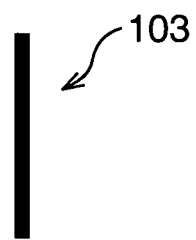
Figure 11A:
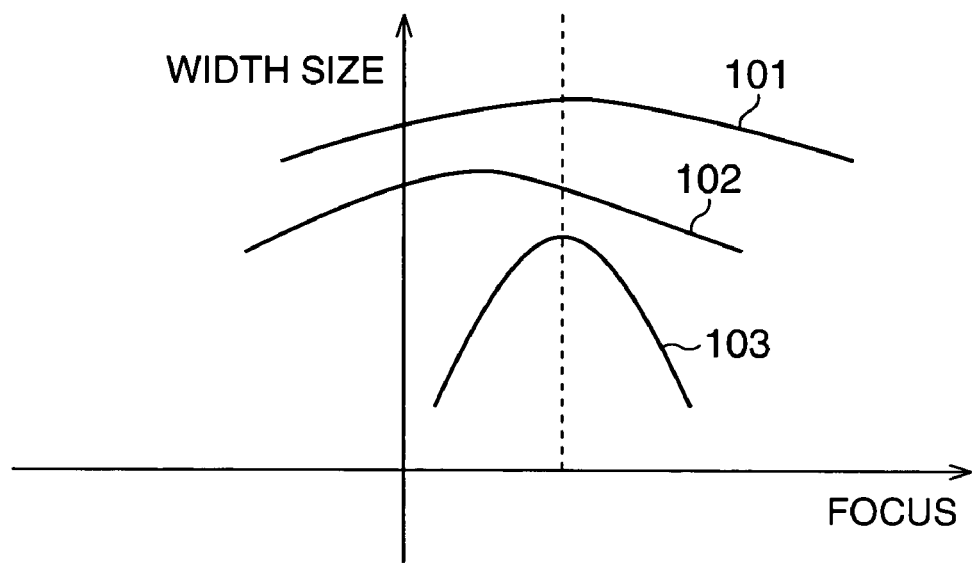
FIGS. 11A and 11B are characteristic charts showing a relation between a width of a transferred pattern and a focus, and a relation between a difference between the widths of the transferred patterns and the focus, respectively, in the forth example according to the first embodiment.
Figure 11B:
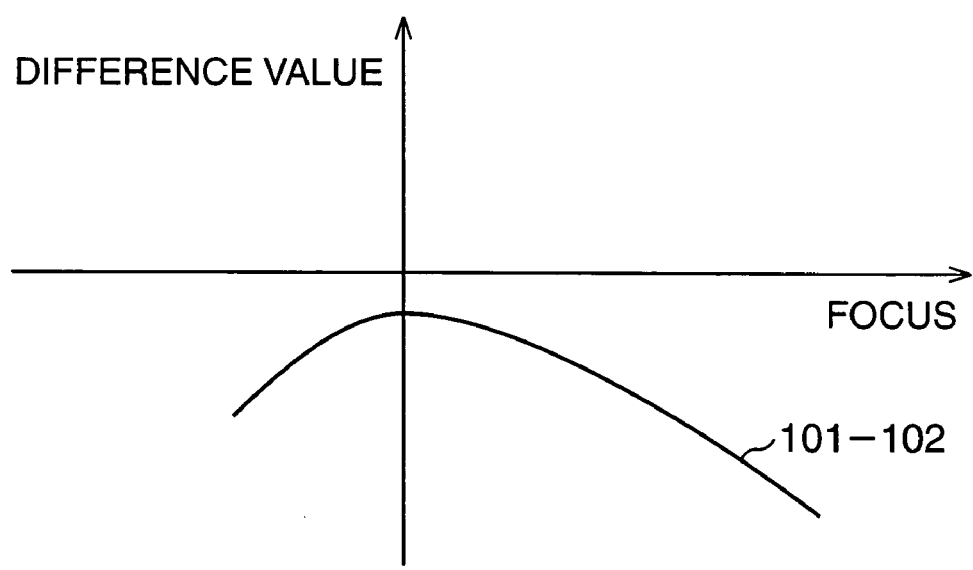

Generally, when forming a pattern by the aligner having spherical aberration, there arises a difference from an optical focus position due to patterns having different pitches. For instance, FIG. 11A shows a result of surveying a relation between a width of a transferred pattern and a focus using L & S patterns 101, 102 shown in FIGS. 10A and 10B and having mutually different pitches, and an isolated pattern shown in FIG. 10C. Here, the L & S pattern 101 is closer than the L & S pattern 102 in density, and 101a, 102a are respective transferred patterns thereof. In the case of the aligner having spherical aberration, as shown in FIG. 11A, there arise larger focus errors in the transferred patterns 101a, 102a than in the transferred pattern 103. As shown in FIG. 11B, in this case, by obtaining knowledge on the relation between the difference of the widths of the transferred patterns 101a, 102a and the focus, the determination whether the focus error is positive or negative is enabled. The L & S patterns 62, 63 are the patterns for detecting the focus error and the exposure error by taking advantage of this characteristic and especially works when having small astigmatism and large spherical aberration.

[Focus Error and Exposure Error Correction Method]

In this embodiment, as previously described, the focus error and the exposure error are corrected by obtaining information on the focus error amount and the exposure error amount.

FIG. 12 is a schematic view for illustrating a correction method of the focus error and the exposure error according to the present embodiment.

According to this correction method, lithography is performed first by exposing a lot A under standard focus condition, exposure condition, and focus gradient condition. After that, the focus error amount, the exposure error amount, and a focus gradient amount are calculated for the lot A by the exposure measurement method (step S1 to step S5 in FIG. 2). The focus gradient amount here can be measured by targeting the patterns at four corners in a shot.

Subsequently, the calculated focus error amount, exposure error amount and focus gradient amount are fed back in a following lot B. With the appropriate exposure error and focus gradient amount, step S1 to step S5 are performed to the lot B to calculate a focus error amount, exposure error amount and focus gradient amount, and the result is fed back to a following lot C. Similarly, calculated focus error, exposure error, and focus gradient amounts are fed back to a following lot D.

In this manner, in the example shown in the drawing, step S1 to step S5 are repeated until appropriate focus amount, exposure amount, and focus gradient amount are obtained in a lot X. Thus, by reflecting prior focus error, exposure error, and focus gradient amounts in the following lot, extremely accurate focus and exposure control are enabled.

[Semiconductor Manufacturing Method Including Measurement of Focus error amount, Exposure error Amount, and Focus Gradient Amount]

According to the present embodiment, in the lithography process, as described above, by knowing information on the focus error, exposure error, and focus gradient amounts (hereinafter collectively referred to as "variation amount") and by making use of the information, a desired pattern formation is performed with high accuracy.

Figure 13:
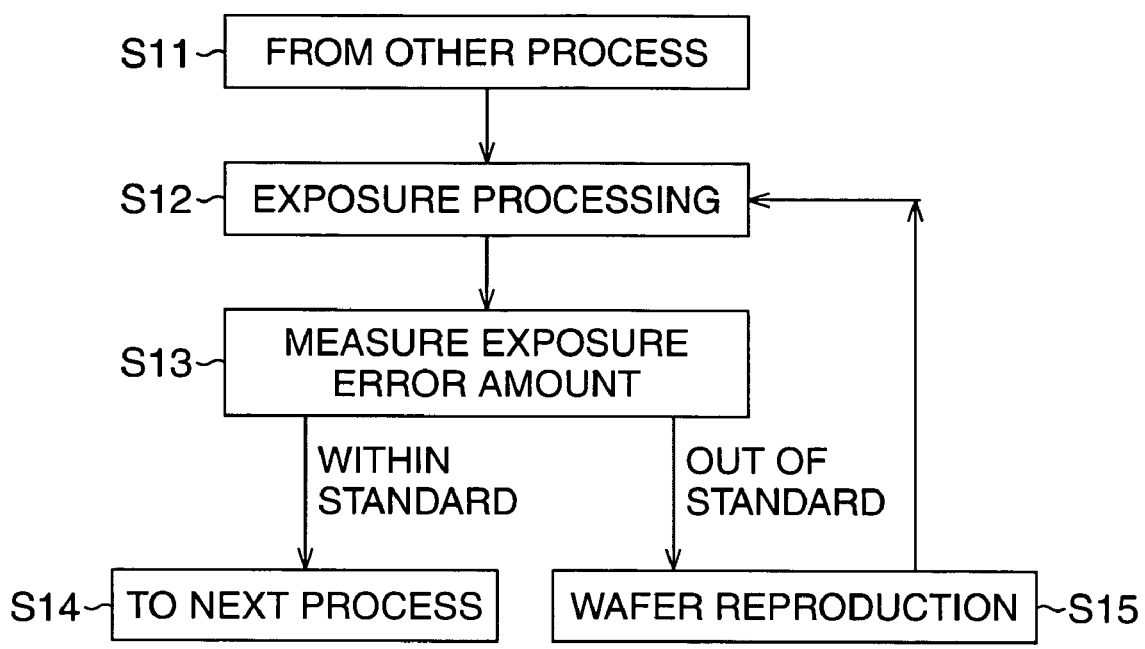
FIG. 13 is a flowchart showing a semiconductor device manufacturing method according to the first embodiment.

FIG. 13 is a flowchart showing a semiconductor device manufacturing method according to the present embodiment.

Firstly, a lot, which comes from step S11 being a preceding process (photo mask producing process, wafer producing process, and so forth), is placed under an exposure processing (step S12).

Substantially, the variation amount is measured for example by the calculation in the step S1 to step S5 in FIG. 2 (step S13).

As a result, when the variation amount is determined to meet a standard, then a procedure goes to a next step (assembling process and so forth including dicing) (step S14), and when the variation amount is determined to be out of the standard, the resist is peeled and the exposure processing is performed again (step S15). For this reprocessing, the variation amount out of the standard is fed back, so that the pattern formation with higher accuracy can be performed. When result shows no problem, it is possible to go to the next step. By performing such procedures, a product yield is expected to be improved substantially.

Second Embodiment

In this second embodiment, an example formation method of a transferred pattern used in the present invention will be described.

Generally, as a transferred pattern to be a target for measuring a focus error, a resist pattern formed by lithography is used. However, a thin film pattern formed by etching a certain thin film formed under the resist pattern using the resist pattern as a mask may sometimes be superior to the resist pattern in measurement repeatability since the thin film pattern shows higher contrast to an electron beam and the like used for measuring the width.

Figure 14A:
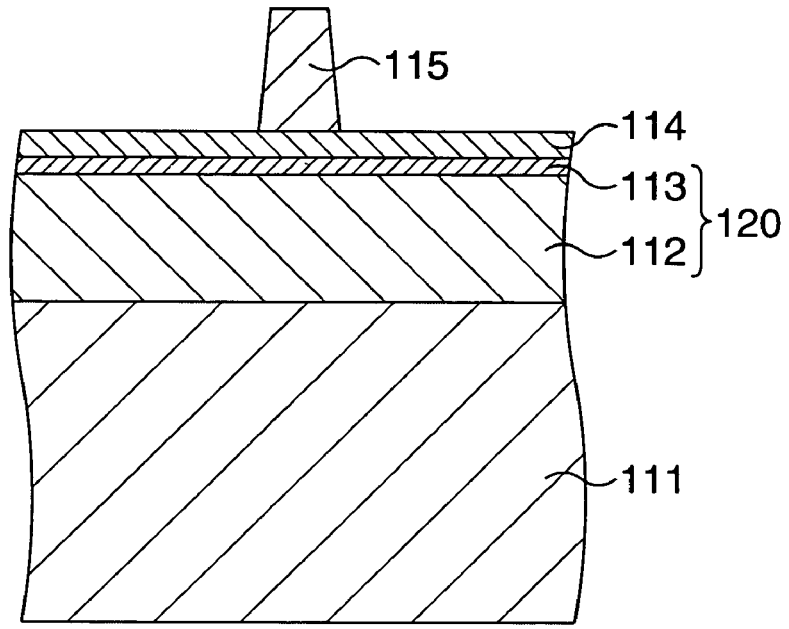
FIGS. 14A and 14B are schematic sectional views showing how a thin film pattern is formed on a silicon substrate being a transfer object.
Figure 14B:
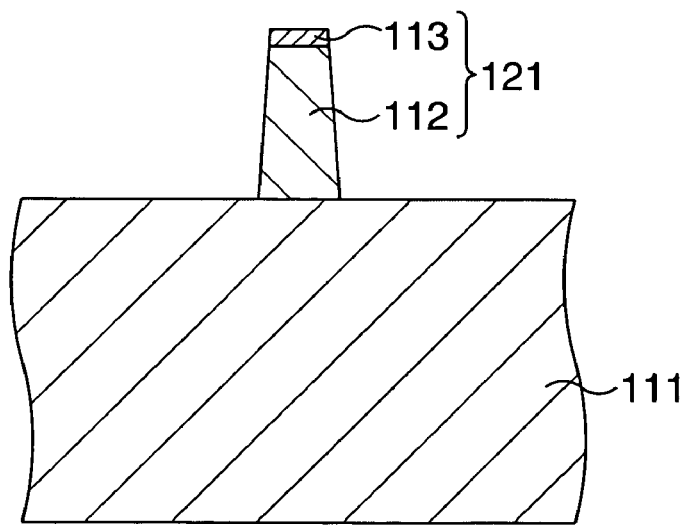

FIGS. 14A and 14B are schematic sectional views showing how a thin film pattern is formed on a silicon substrate being a transfer object.

For instance, as shown in FIG. 14A, a polycrystalline silicon film 112 is deposited on a silicon substrate 111 by CVD method or the like, and a SiO film 113 and an antireflection film 114 are formed further thereon in this order. Here, a thin film 120 is constituted by the polycrystalline silicon film 112 and the SiO film 113. Subsequently, a resist is coated over the antireflection film 114, and the resist is processed by a photolithography to form a resist pattern 115.

As shown in FIG. 14B, using the resist pattern 115 as a mask, an anisotropic dry etching is performed to the polycrystalline silicon film 112, the SiO film 113, and the antireflection film 114. At this time, the thin film 120 is processed to a thin film pattern 121 by following the shape of the resist pattern 115 by the anisotropic dry etching. The resist pattern 115 and the antireflection film 114 are removed. Incidentally, for convenience of drawing, the FIG. 14B shows a state after the resist pattern 115 and the antireflection film 114 are removed.

The thin film pattern 121 formed in the above-described manner exhibits higher contrast to the electron bean or the like between the thin film pattern 121 and the silicon substrate 111, so that a size measurement with higher accuracy than that using the resist pattern 115 is possible, whereby a focus error measurement with high accuracy is realized.

Note that, as a material for the thin film pattern being within the scope of the focus error measurement, those can exhibit high contrast to the electron beam and so forth between the silicon substrate, for example, a polycrystalline silicon film, SiO, SiN, metal, or the like can be employed.

Another Embodiment Adopting the Present Invention

The above-described respective means constituting the exposure measurement apparatus (except for the size measurer), the exposure measurement method, the correction method, the respective steps (step S1 to step S5 in FIG. 2, step S11 to step S15, or the like) of the semiconductor device manufacturing method can be realized by operating the program or a computer-readable record medium in which the program is recorded. The program and the computer-readable record medium in which the program is recorded are within the scope of the present invention.

More specifically, the above-described program is recorded in a record media such as a CD-ROM, or provided into a computer via various transmitting media. As a record medium recording the program, a flexible disc, a hard disc, a magnetic tape, an optical magnetic tape, a non volatile memory card, and the like can be employed, in addition to the CD-ROM. Meanwhile, as a transmitting medium of the program, a computer network (a LAN, a WAN such as an Internet, a wireless communication network, or the like) for supplying a program information by propagating the information as a carrier wave, and a communication medium in a system (a wired circuit such as via an optical fiber, or the like, a wireless circuit, and the like) are usable.

Further, in addition to the case where a function of the above-described embodiment is realized by executing the supplied program by the computer, those cases where the program cooperated with an OS (operating system), the other application software, or the like, that are operating in the computer to realize the function of the embodiment, and where all or parts of the supplied program are performed by a function expansion board or a function expansion unit of the computer to thereby realize the function of the embodiment are also within the scope of the present invention.

Figure 15:
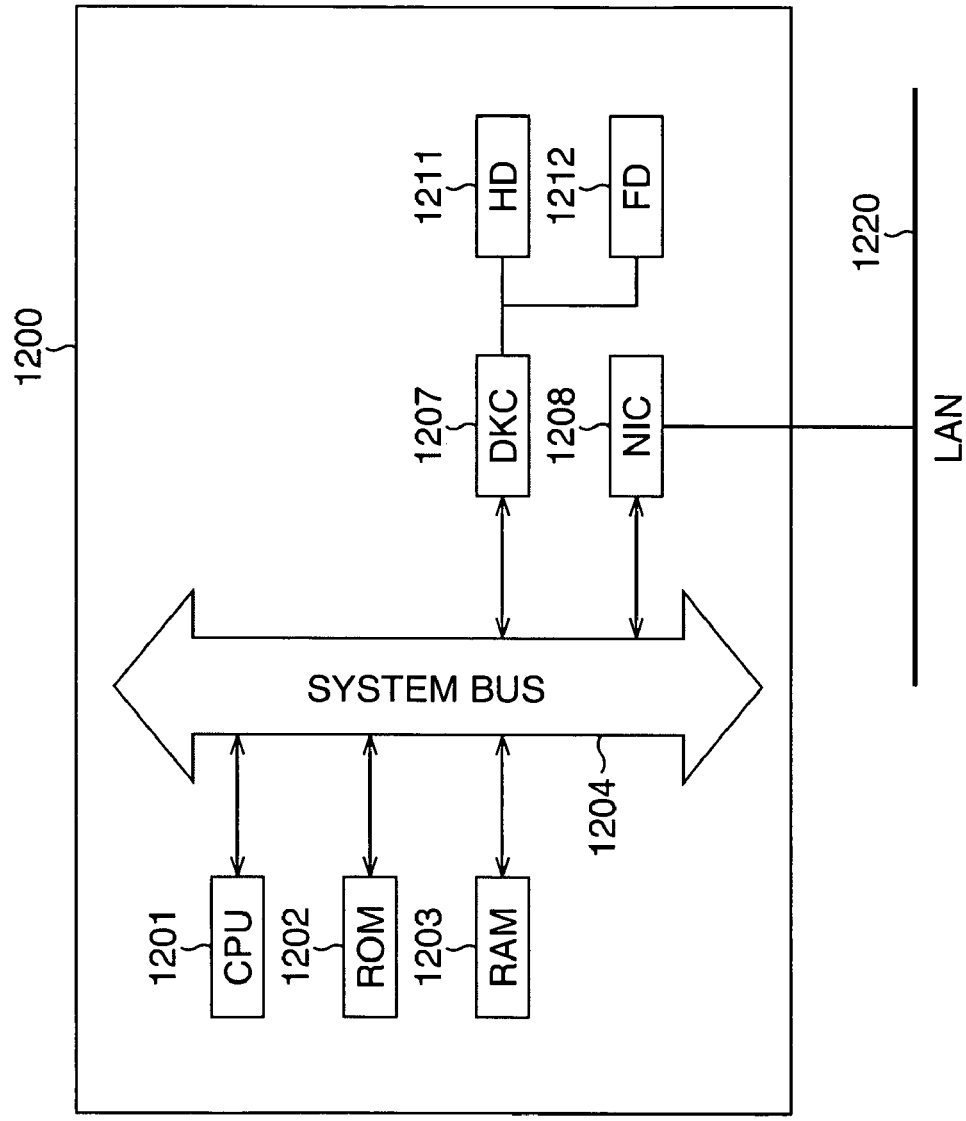
FIG. 15 is a schematic diagram showing an internal configuration of a terminal equipment for an individual user.

For instance, FIG. 15 is a schematic view showing an internal configuration of a terminal equipment for an individual user. In FIG. 15, "1200" denotes a personal computer. The PC 1200 includes a CPU 1201 and executes a device control software stored in a ROM 1202 or a hard disc (HD) 1211, or supplied by a flexible disc drive (FD) 1212, to thereby control respective devices connected to a system bus 1204 comprehensively.

According to the present invention, it is enabled to measure a focus variation amount easily with high accuracy. Further, by reflecting the resulting focus variation to a next lot or a next process, a fine pattern can be formed with high accuracy.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. An exposure measurement method comprising the steps of:
    setting a pair of pattern images having mutually different optimal focus positions in a shot image and measuring respective sizes of a pair of transferred patterns formed onto a transfer object corresponding to the pair of the pattern images;
    obtaining a difference value between the size of one transferred pattern and the size of the other transferred pattern; and
    calculating a focus variation amount of the transfer object using the difference value,
    wherein the pair of transferred patterns is formed at four corners of the transfer object in one exposure site respectively, and after calculating the focus variation amount of the respective corners, a tilt component of the focus variation amount in the X direction and Y direction of the exposure site is estimated by using the calculated focus variation amount of the respective corners and a focus gradient amount is calculated.

2. The exposure measurement method according to claim 1,
    wherein at least the transferred patterns at four positions in an exposure site are used.

3. The exposure measurement method according to claim 1,
    wherein each of the pair of transferred patterns is in a shape of a straight line isolated from each other.

4. The exposure measurement method according to claim 1,
   wherein each of the pair of transferred patterns is in a radial pattern having at least eight straight line portions extending radially from a center thereof and the sizes of the respective straight line portions are measured.

5. The exposure measurement method according to claim 1,
   wherein the focus variation amount is determined using a database having a data indicating a relation between the difference value and the focus variation amount, in said calculation step of the focus variation amount.

6. The exposure measurement method according to claim 1,
   wherein the pair of transferred patterns is a thin film pattern being a thin film formed on a transfer object and processed using a resist pattern formed on the thin film by lithography as a mask.

7. The exposure measurement method according to claim 1,
   wherein each of the pair of transferred patterns is one of a plurality of straight-line shaped patterns aligned adjacently in parallel with each other by having different pitches therebetween.

8. The exposure measurement method according to claim 1,
   wherein each of the pair of transferred patterns is in a kinked line shape having two straight line portions and the sizes of the respective straight line portions are measured.

9. The exposure measurement method according to claim 1, further comprising the step of calculating an exposure variation amount of the transfer object using the size of the pair of transferred patterns and the focus variation amount.

10. The exposure measurement method according to claim 8,
    wherein each of the pair of transferred patterns is formed by being shaped into an L shape or a V shape in the exposure site.

11. The exposure measurement method according to claim 9,
    wherein the exposure variation amount is determined in said respective calculation steps of the focus variation amount and the exposure variation amount using a database having a data indicating a relation between the size of the pair of transferred patterns and the focus variation amount and the exposure variation amount.

12. An exposure measurement apparatus comprising:
    a size measurer that measures sizes of a plurality of transferred patterns formed by being transferred onto a transfer object;
    a difference value calculator that obtains a difference value between the sizes of the plurality of transferred patterns; and
    a focus variation amount calculator that calculates a focus variation amount of the transfer object using the difference value,
    wherein the size measurer measures respective sizes of a pair of transferred patterns formed corresponding to a pair of pattern images having mutually different optimal focus positions in a shot image, and measures respective sizes of a pair of transferred patterns formed corresponding to the pair of the pattern images, and
    wherein the difference value calculator obtains a difference value between the size of the one transferred pattern and the size of the other transferred pattern in the pair of the transferred patterns,
    wherein the pair of transferred patterns is formed at four corners of the transfer object in one exposure site respectively, and after calculating the focus variation amount of the respective corners, the focus variation amount calculator estimates a tilt component of the focus variation amount in the X direction and Y direction of the exposure site by using the calculated focus variation amount of the respective corners and calculates a focus gradient amount.

13. The exposure measurement apparatus according to claim 12,
    wherein at least the transferred patterns at four positions in an exposure site are used.

14. The exposure measurement apparatus according to claim 12,
    wherein each of the pair of transferred patterns is in a shape of a straight line isolated from each other.

15. The exposure measurement apparatus according to claim 12,
    wherein each of the pair of transferred patterns is in a radial pattern having at least eight straight line portions extending radially from a center thereof and the sizes of the respective straight line portions are measured.

16. The exposure measurement apparatus according to claim 12,
    wherein said focus variation amount calculator determines the focus variation amount using a database having a data indicating a relation between the difference value and the focus variation amount.

17. The exposure measurement apparatus according to claim 12,
    wherein each of the pair of transferred patterns is one of a plurality of straight-line shaped patterns aligned adjacently in parallel with each other by having different pitches therebetween.

18. The exposure measurement apparatus according to claim 12,
    wherein each of the pair of transferred patterns is in a kinked line shape having two straight line portions and the sizes of the respective straight line portions are measured.

19. The exposure measurement apparatus according to claim 12, further comprising an exposure variation amount calculator that calculates an exposure variation amount of the transfer object using the size of the pair of transferred patterns and the focus variation amount.

20. The exposure measurement apparatus according to claim 18,
    wherein each of the pair of transferred patterns is formed by being shaped into an L shape or a V shape in the exposure site.

21. The exposure measurement apparatus according to claim 19,
    wherein said exposure variation amount calculator determines the exposure variation amount using a database having a data indicating a relation between the size of the pair of transferred patterns and the focus variation amount and the exposure variation amount.

22. A semiconductor device manufacturing method comprising:
    a first step for forming a plurality of transferred patterns on a transfer object;
    a second step for setting a pair of pattern images having mutually different optimal focus positions in a shot image and measuring respective sizes of a pair of transferred patterns formed onto the transfer object corresponding to the pair of the pattern images;

a third step for obtaining a difference value between the size of one transferred pattern and the size of the other transferred pattern;

a fourth step for calculating a focus variation amount of the transfer object using the difference value; and a fifth step for determining whether or not the calculated focus variation amount meets a standard, wherein if the focus variation amount is determined to meet the standard, then a procedure goes to a next step and if the focus variation amount is determined to be out of the standard, then the plurality of transferred patterns are removed and said first to fifth steps are reexecuted thereafter, wherein the pair of transferred patterns is formed at least at four corners of the transfer object in one exposure site respectively, and after calculating the focus variation amount of the respective corners, a tilt component of the focus variation in the X direction and Y direction of the exposure site is estimated by using the calculated focus variation amount of the respective corners and a focus gradient amount is calculated.

23. The semiconductor device manufacturing method according to claim 22, wherein at least the transferred patterns at four positions in an exposure site are used.

24. The semiconductor device manufacturing method according to claim 22, wherein each of the pair of transferred patterns is in a shape of a straight line isolated from each other.

25. The semiconductor device manufacturing method according to claim 22, wherein each of the pair of transferred patterns is in a radial pattern having at least eight straight line portions extending radially from a center thereof and the sizes of the respective straight line portions are measured.

26. The semiconductor device manufacturing method according to claim 22, wherein the focus variation amount is determined using a database having a data indicating a relation between the difference value and the focus variation amount, in said fourth step.

27. The semiconductor device manufacturing method according to claim 22, wherein the pair of transferred patterns is a thin film pattern being a thin film formed on a transfer object and processed using a resist pattern formed on the thin film by lithography as a mask.

28. The semiconductor device manufacturing method according to claim 22, wherein each of the pair of transferred patterns is one of a plurality of straight-line shaped patterns aligned adjacently in parallel with each other by having different pitches therebetween.

29. The semiconductor device manufacturing method according to claim 22, wherein each of the pair of transferred patterns is in a kinked line shape having two straight line portions and the sizes of the respective straight line portions are measured.

30. The semiconductor device manufacturing method according to claim 22, wherein an exposure variation amount is calculated and also the exposure variation amount of the transfer object is calculated using the size of the pair of transferred patterns and the focus variation amount in said fourth step.

31. The semiconductor device manufacturing method according to claim 29, wherein each of the pair of transferred patterns is formed by being shaped into an L shape or a V shape in the exposure site.

32. The semiconductor device manufacturing method according to claim 30, wherein the exposure variation amount is determined in said fourth step using a database having a data indicating a relation between the size of the pair of transferred patterns and the focus variation amount and the exposure variation amount.

* * * * *